(12) United States Patent
Goodfellow et al.

(10) Patent No.: US 6,559,684 B2
(45) Date of Patent: May 6, 2003

(54) SYSTEM AND METHOD FOR CURRENT SENSING

(75) Inventors: Ryan Goodfellow, Mesa, AZ (US); David Susak, Phoenix, AZ (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 10/141,052

(22) Filed: May 8, 2002

(65) Prior Publication Data

US 2002/0158615 A1 Oct. 31, 2002

Related U.S. Application Data

(63) Continuation of application No. 09/978,296, filed on Oct. 15, 2001, now abandoned.
(60) Provisional application No. 60/240,339, filed on Oct. 13, 2000.

(51) Int. Cl.$^7$ ............................................. G01R 19/00
(52) U.S. Cl. .......................... 327/53; 327/543; 327/538
(58) Field of Search ................................. 327/543, 538, 327/530, 427, 431, 434, 436, 437, 52, 53, 51, 65, 66; 323/316

(56) References Cited

U.S. PATENT DOCUMENTS

| | | | |
|---|---|---|---|
| 4,885,477 A | * 12/1989 | Bird et al. | ..................... 327/52 |
| 5,760,613 A | 6/1998 | Pulvirenti et al. | |
| 5,815,027 A | 9/1998 | Tihanyi et al. | |
| 5,969,513 A | 10/1999 | Clark | |
| 6,011,413 A | 1/2000 | Hayakawa et al. | |
| 6,020,729 A | 2/2000 | Stratakos et al. | |
| 6,031,361 A | 2/2000 | Burstein et al. | |
| 6,100,676 A | 8/2000 | Burstein et al. | |
| 6,160,441 A | 12/2000 | Stratakos et al. | |
| 6,198,261 B1 | 3/2001 | Schultz et al. | |
| 6,225,795 B1 | 5/2001 | Stratakos et al. | |
| 6,268,716 B1 | 7/2001 | Burstein et al. | |
| 6,479,975 B1 | * 11/2002 | Plankensteiner et al. | .... 323/316 |

FOREIGN PATENT DOCUMENTS

| | | |
|---|---|---|
| DE | 198 38 657 A 1 | 3/2000 |
| WO | WO 00/26738 | 5/2000 |

OTHER PUBLICATIONS

Stratakos, Anthony J., "High–Efficiency Low–Voltage DC–DC Conversion for Portable Applications," pp.1–236 No Date.
Lenk, Ron, "Optimum Current Sensing Techniquest in CPU converts", Fairchild Semiconductor Application Bulletin AB–20, pp1–4 Jan. 1999.
Peterchev, Angel V. and Seth R. Sanders, "Quantization Resolution and Limit Cycling in Digitally Controlled PWM Converters," pp. 1–14 No Date.
Xiao, Jinwen, et al., "Architecture and IC Implementation of a Digital VRM Controller," pp. 1–10 No Date.

* cited by examiner

Primary Examiner—Shawn Riley
(74) Attorney, Agent, or Firm—Snell & Wilmer

(57) ABSTRACT

A system and method for current sensing which is substantially consistent over device, temperature, and process variations is provided. A current sensing system includes a first switch coupled to one or more variable resistive elements. The resistive elements being configured to scale down the voltage across the first switch which is provided to an input of an amplifier. The amplifier is coupled to the resistive elements and the second switch and is configured to sense the voltage across the first switch, and force the voltage across the second switch to be equal to the first switch scaled down voltage. Thus, a current of known proportion can be provided at the output of the amplifier. A driver and timing circuit may be provided to prevent the amplifier from providing an excessive slewing of current during the off period.

33 Claims, 10 Drawing Sheets

SYSTEM AND METHOD FOR CURRENT SENSING

RELATED APPLICATIONS

This application is a continuation of U.S. Ser. No. 09/978,296, filed on Oct. 15, 2001, now abandoned the disclosure of which is hereby incorporated by reference.

This patent application claims priority to, and the benefit of, the U.S. provisional patent application entitled "SYSTEM AND METHOD FOR CURRENT SENSE" filed on Oct. 13, 2000 as U.S. Ser. No. 60/240,339, the entire contents of which is hereby incorporated by reference.

FIELD OF INVENTION

The present invention generally relates to current sensing, and more particularly, to a system and method for current sensing which is substantially consistent over device, temperature, and process variations.

BACKGROUND OF THE INVENTION

Current measurement techniques in electronic devices provide a variety of functions: fault protection, current control, switching, and/or the like. Various types and configurations of current sensors have been developed for current measurement. In such current sensors, it is desirable to restrict variations in device, temperature, process, and aging characteristics of circuit components and parasitic elements. Despite efforts to restrict, variations in such characteristics remain a problem. Further, correcting inaccuracies in sensing the current waveform can require additional printed circuit board (PCB) area and additional components, e.g., discrete resistors, which can increase cost and decrease system efficiency.

With reference to FIG. 1A, a switch mode circuit 100 is illustrated for providing a current to a load device. Circuit 100 includes a pair of switches $Q_1$ and $Q_2$ comprising a p-channel FET (Field Effect Transistor) device and an n-channel FET device, respectively, although both switches $Q_1$ and $Q_2$ could comprise n-channel FET devices as well. The gates of switches $Q_1$ and $Q_2$ are connected to an FET drive circuit 102, while the drains of switches $Q_1$ and $Q_2$ are coupled to a load 104 through various elements, including an inductor $L_1$ and a capacitor $C_1$. FET drive circuit 102 is configured with switches $Q_1$ and $Q_2$ to alternately couple inductor $L_1$ to supply voltage VCC and ground. For example, as illustrated with reference to FIG. 1B, as switch Q1 is turned "on", during a time $T_{ON}$, the voltage at a node $V_{SW}$ is high, i.e., connected to supply voltage $V_{CC}$, causing the current $I_{L1}$ to ramp upwards within inductor $L_1$. In that the voltage V across an inductor is the product of the inductance L times the change in current over time di/dt, the rate of change of current for inductor $L_1$ can be derived in equations (1) and (2) below:

$$V = L \cdot \frac{di}{dt} \quad (1)$$

$$\frac{di}{dt} = (Vin - Vout)/L \quad (2)$$

During a time $T_{OFF}$, switch Q2 will turn on, the voltage at a node $V_{SW}$ will go low, resulting in a pulsed waveform switching between approximately zero volts and VCC, and current $I_{L1}$ will ramp downward through inductor $L_1$, at a rate set forth in equation (3) below:

$$\frac{di}{dt} = Vout/L \quad (3)$$

Currently, it is difficult to accurately sense this inductor current $I_{L1}$ without dissipating significant power. Moreover, variations in discrete circuit elements negatively impact accurate current sensing, e.g., variations in temperature, process, and/or the like will have varying effects on the differing discrete circuit elements, which will produce inaccuracy in current sensing. In addition, other current sensing techniques commonly used, such as Rds(ON) sensing techniques of a power device, can have reduced accuracy. For example, FETs can have variations in resistance of about 40% in such Rds(ON) sensing techniques, which decreases the accuracy of current sensing. Other techniques include the placing of an RC network across the inductor, in which the effective series inductance (ESL) of the inductor is used to select the resistance used in the RC network. Unfortunately, the ESL has initial and temperature variations, which lead to inaccuracies in current sensing. Other techniques may utilize a sense resistor for current sensing, but which exhibit power losses, e.g., $I^2R$ losses.

Many current sensor applications include the use of current mirror circuits configured with operational amplifiers to provide a sensed current based on a load current. For example, current mirror circuits have included a first resistor of known resistance placed in series with a load device, and have measured the voltage drop across the resistor through use of the operational amplifier and a second resistor to calculate the current passing through the load device, e.g., by knowing the drop across the first resistor and forcing that voltage at both the inverting and non-inverting inputs of the amplifier, a sensed current of known proportion to the load current can be provided at the output of the amplifier. In addition to the difficulty and high costs in fabricating resistors within integrated circuit devices, matching a resistor to the power device is difficult to achieve due to variations in process.

With reference to FIG. 2, another prior art application including a current sensor 200 is illustrated. Current sensor 200 is configured as a basic current mirror circuit as described above, with the first and second resistors being replaced with p-channel transistors $Q_P$ and $Q_R$ configured to operate as variable resistive devices. For example, in that MOSFET devices can operate as linear resistors whose value can be controlled and/or varied by overdrive voltage when operating within the triode region, such as is disclosed by Behzad Razavi, DESIGN OF ANALOG CMOS INTEGRATED CIRCUITS (McGraw-Hill 2001), current sensor 200 can use the variable resistor devices $Q_P$ and $Q_R$ with an amplifier 202 to mirror a load current $I_{LOAD}$, and thus provide an output current $I_{SENSE}$ representing a known proportion of load current $I_{LOAD}$. In particular, current sensor 200 can sense the voltage at node $V_1$, and by forcing the voltage at node $V_2$ to equal the voltage at node $V_1$ through amplifier 202, generate a scaled current through a follower transistor $Q_F$, to provide sensed current $I_{SENSE}$.

However, current sense circuit 200 has various operational deficiencies. For example, current mirror circuit 200 generally requires a high speed amplifier for operational amplifier 202 to force the voltage at node $V_2$ to equal the voltage at node $V_1$, which can be difficult to implement in processes optimized for high voltage power devices, i.e., it is difficult to use high voltage devices in a high speed amplifier. Moreover, during switch mode applications, the voltage at node $V_1$ will equal the voltage at node $V_{SW}$, including having a pulsed waveform between $V_{CC}$ and ground. Thus, when the voltage at node $V_{SW}$ is low, and thus low at node $V_1$, amplifier 202 will attempt to slew sufficient current to pull the voltage at node $V_2$ to ground, which can amount to a significant amount of current being pulled from current sense circuit 200.

Accordingly, a system and method for more accurate current sensing over device, temperature, and process variations are desired, particularly for applications sensing high di/dt currents.

SUMMARY OF THE INVENTION

The present invention includes a system and method for current sensing which is substantially consistent over device, temperature, and process variations. In accordance with one aspect of the present invention, a current sensing system and method are configured to provide a scaled down sense current of a known proportion to a load current being sensed. In an exemplary embodiment of the present invention, an exemplary current sensing system includes a first switch coupled to one or more variable resistive elements, wherein the resistive elements are configured to facilitate scaling of the current output from the first switch. A second switch is coupled to the first switch, wherein the size of the second switch is suitably scaled down relative to the size of the first switch. In addition, both switches can be fabricated using substantially the same process. The resistive elements are configured to scale down the voltage across the first switch, with the scaled down voltage being provided to an input of an amplifier. The amplifier is coupled with the resistive elements and the second switch, and is configured to sense the scaled down voltage across the first switch, and force the voltage across the second switch to be equal to the scaled down voltage across the first switch, such that a current of known proportion to the load current can be provided at the output of the amplifier.

In accordance with another aspect of the present invention, to prevent the amplifier from providing an excessive slewing of current from the second switch to ground during the off period of the current sensing circuit, a driver and timing circuit can be provided. The driver and timing circuit can be configured to decouple a resistive switch connected to the input of the amplifier to prevent the amplifier from excessive slewing when the voltage at the input node is low, e.g., when the first switch is not being driven. In addition, another resistive switch can be configured to facilitate biasing of the amplifier when the first switch is not being driven, i.e., when current sensing circuit is not sensing current. As a result, the current sensing circuit can include the use of low voltage devices with a high voltage overlay in the amplifier to provide for higher speed and accuracy.

BRIEF DESCRIPTION OF THE DRAWINGS

The subject invention will hereinafter be described in the context of the appended drawing figures, wherein like numerals denote like elements, and.

DETAILED DESCRIPTION OF EXEMPLARY EMBODIMENTS

Figure 1A:
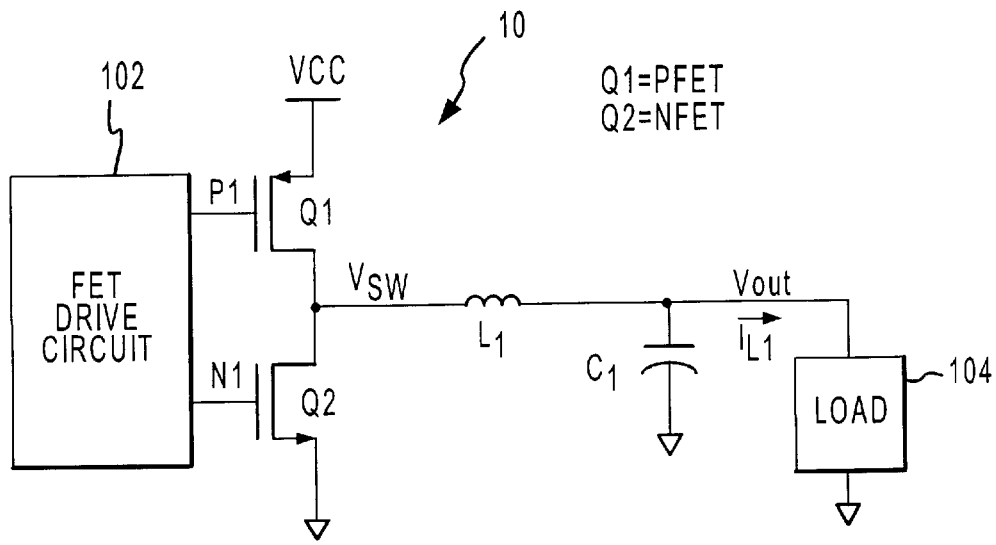
FIG. 1A illustrates a prior art switch mode circuit for providing a current to a load device.
Figure 1B:
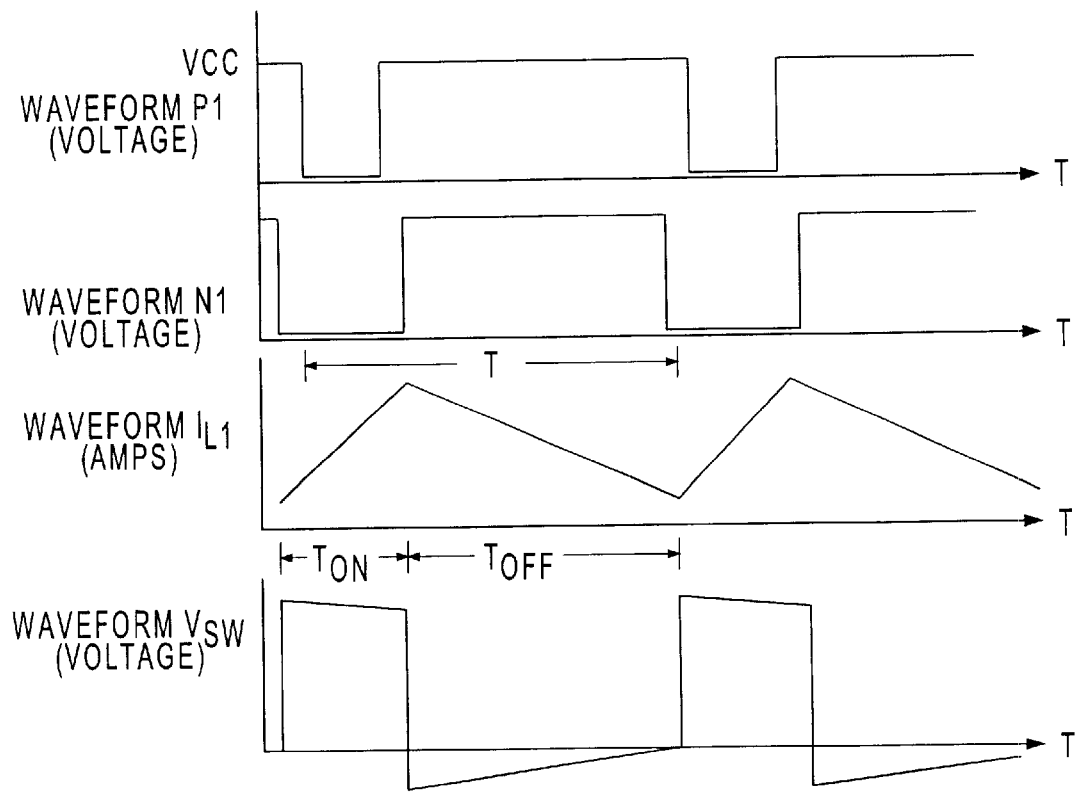
FIG. 1B illustrates a timing diagram for operation of the switch mode circuit of FIG. 1A.
Figure 2:
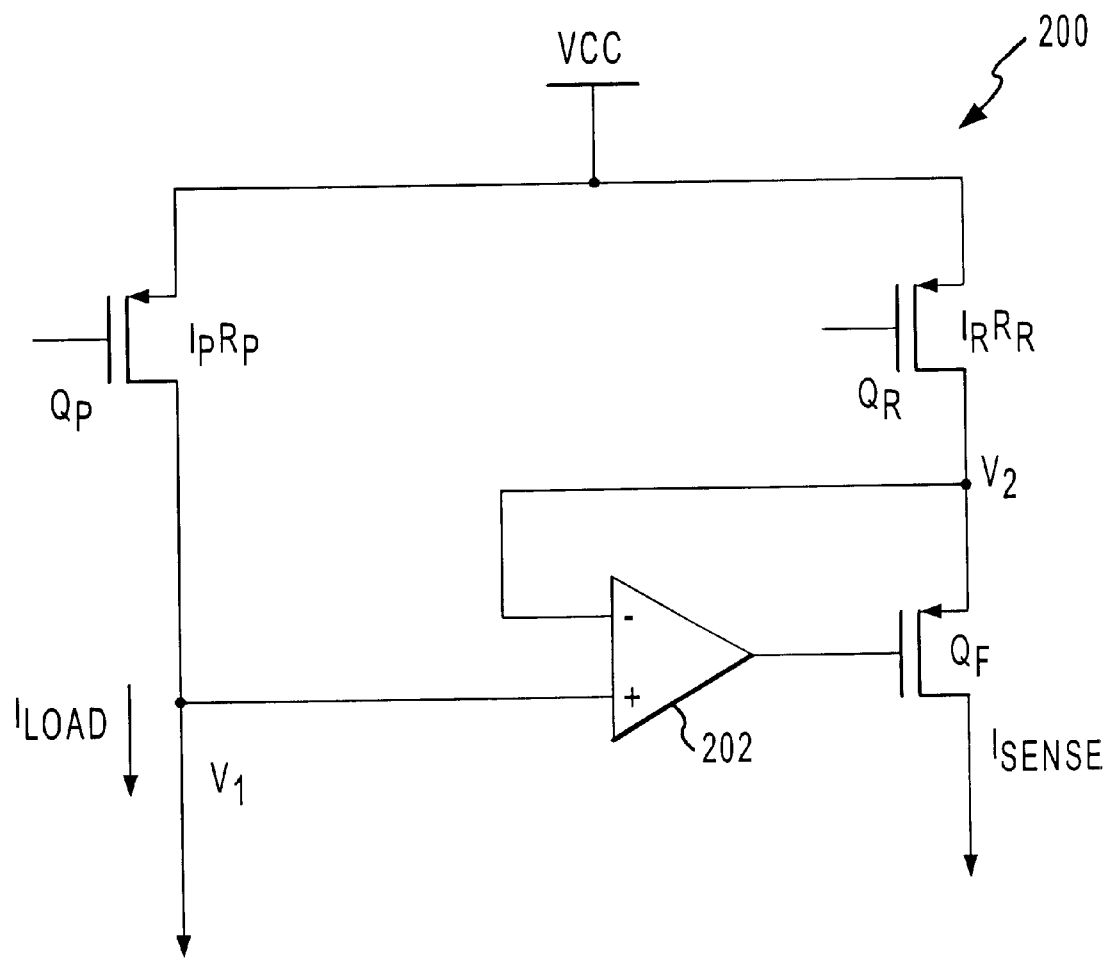
FIG. 2 illustrates a prior art current sense circuit implementing a current mirror circuit.

The present invention may be described herein in terms of various functional components and various operational steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes, and the operation of which may be controlled by any type of controller device. In addition, the present invention may be practiced in any integrated circuit application for measuring or sensing current. Such general applications that may be appreciated by those skilled in the art in light of the present disclosure are not described in detail herein. However for purposes of illustration only, exemplary embodiments of the present invention will be described herein in connection with current sensor circuits configured for use in switch mode applications, such as a switching power converter.

Further, it should be noted that the particular implementations shown and described herein are illustrative of various exemplary embodiments of the present the invention and its best mode and are not intended to otherwise limit the scope of the present invention in any way. For example, while various implementations for sensing current are illustrated with PFET devices, it should be apparent to one skilled in the art that such current sensing implementations can also be configured for NFET devices. Moreover, it should be noted that while various components may be suitably coupled or connected to other components within exemplary circuits, such connections and couplings can be realized by direct connection between components, or by connection through other components and devices located in between, including, for example, various passive elements, such as resistors, switches and the like.

As discussed above, prior art current sensing systems have variations in device, temperature, process, and aging characteristics of circuit components and parasitic elements that result in less accuracy and efficiency. In addition, such prior art current sensing circuits have difficulty in implementing high speed amplifiers in applications optimized for high voltage power devices. Further, during switch mode applications, the amplifier within the current mirror circuit will attempt to slew sufficient current to pull the voltage at the reference node to ground, which can amount to a significant amount of current being pulled from current sense circuit. However, in accordance with various aspects of the present invention, a system and method for current sensing is provided that is substantially consistent over device, temperature, and process variations.

For purposes of illustration, the current sensing system and method for detecting current conditions is configured for use in a switch mode application, e.g., a Switching Power Converter (SPC) or any fusing application. In an SPC application, it is desirable to have each cell of a multi-phase Voltage Regulation Module (VRM) carry substantially equal current. By sharing current evenly between the phases, the VRM is more reliable due to decreased stress on the VRM components. In accordance with various exemplary embodiments of the present invention, the current sensing system may provide information to analog control logic or a Digital Signal Processor (DSP) containing control algorithms. The information may be used for current mode control, slope compensation, current sharing between phases of a multiphase converter, and/or the like.

In accordance with one aspect of the present invention, a current sensing system and method are configured to provide a scaled down sense current of a known proportion to a load current being sensed. In an exemplary embodiment of the present invention, an exemplary current sensing system includes a first switch, such as a power switch, coupled to one or more variable resistive elements, wherein the resistive elements are configured to facilitate scaling of the current output from the first switch. A second switch, comprising a sensing switch, is coupled to the first switch, wherein the size of the second switch is suitably scaled down relative to the size of the first switch by the respective W/L ratios of the switches. In addition, both switches can be fabricated using substantially the same process, such that the scaled proportions will remain the same regardless of variations in the characteristics of the devices. The resistive elements are configured to scale down the voltage across the first switch, with the scaled down voltage being provided to an input of an amplifier. The amplifier is coupled with the resistive elements and the second switch, and is configured to sense the scaled down voltage across the first switch, and force the voltage across the second switch to be equal to the scaled down voltage across the first switch, such that a current of known proportion to the load current can be provided at the output of the amplifier.

In accordance with another aspect of the present invention, to prevent the amplifier from providing an excessive slewing of current from the second switch to ground during the off period of the current sensing circuit, a driver and timing circuit can be provided. The driver and timing circuit can be configured to decouple a resistive switch connected to the input of the amplifier to prevent the amplifier from excessive slewing when the voltage at the input node is low, e.g., when the first switch is not being driven. In addition, another resistive switch can be configured to facilitate biasing of the amplifier when the first switch is not being driven, i.e., when current sensing circuit is not sensing current. As a result, the current sensing circuit can include the use of low voltage devices with a high voltage overlay in the amplifier to provide for higher speed and accuracy.

Figure 3:
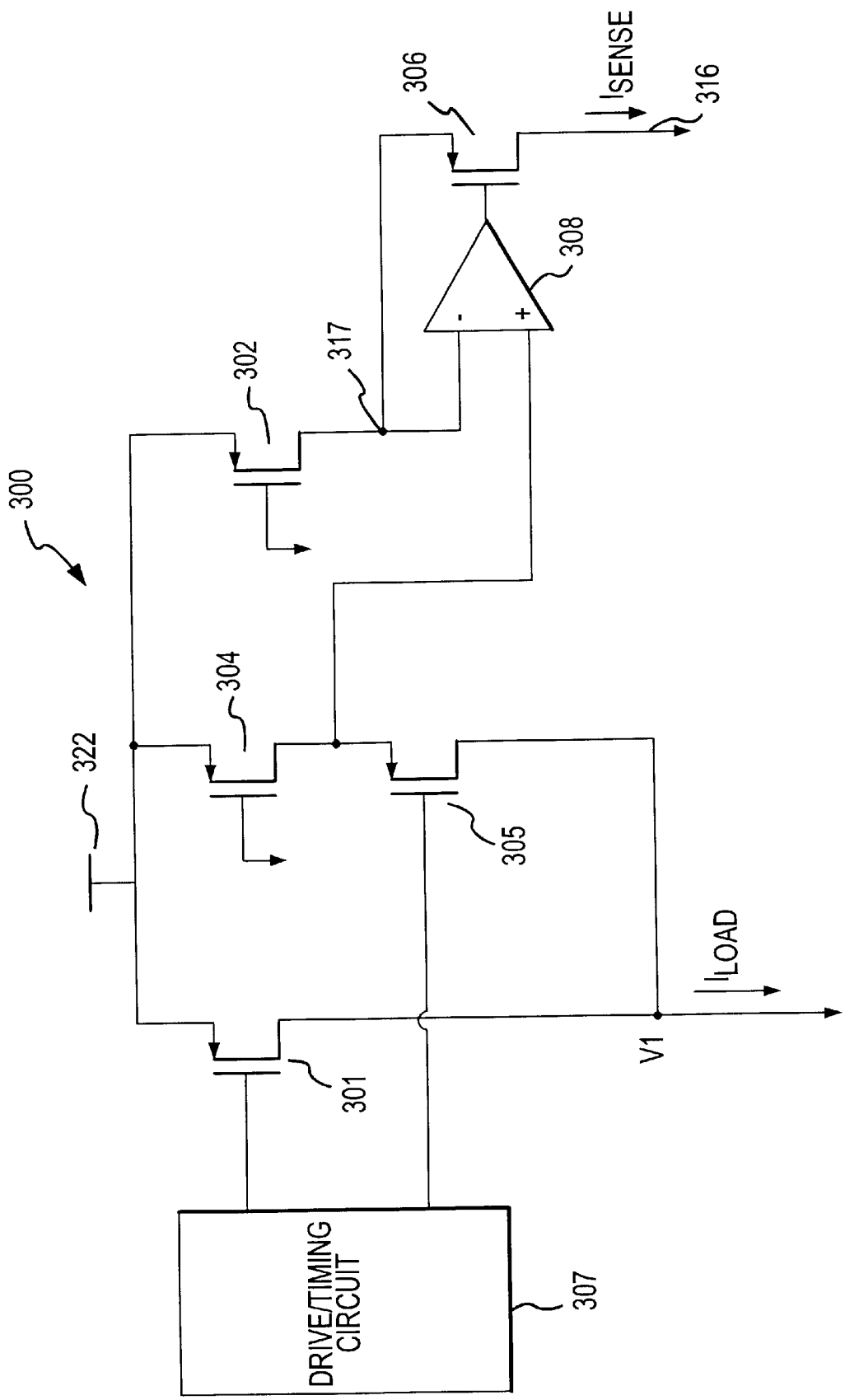
FIG. 3 illustrates a current sensing system in accordance with an exemplary embodiment of the present invention.

With reference to FIG. 3, an exemplary current sensing system 300 in accordance with an exemplary embodiment of the present invention is illustrated. Current sensing system 300 may be used for peak current mode control of a multiphase switching power regulator. For example, current measurement data may be used to determine the ON time (or duty cycle) of each phase of a multiphase switching power regulator, as well as to maintain current sharing in each phase. Current sensing system 300 includes a first switch 301 and a second switch 302, a pair of resistive elements 304 and 305, a driver and timing circuit 307, and an amplifier 308.

Switches 301 and 302 can comprise transistors and may be fabricated using the same process, e.g., standard CMOS (Complimentary Metal Oxide Semiconductor) processes. In this case, switches 301 and 302 are fabricated on the same integrated circuit such that they are electrically substantially identical. Switches 301 and 302 may be multi-cell devices having a plurality of individual transistor elements therein, with switch 302 being a scaled down proportion of switch 301. Alternatively, switch 301 and/or switch 302 may comprise an individual transistor element. Switches 301 and 302 are configured to operate in the deep triode region, e.g., as variable resistors, such as is disclosed more fully by Behzad Razavi, DESIGN OF ANALOG CMOS INTEGRATED CIRCUITS (McGraw-Hill 2001). As a result of the fabrication process, any variations in temperature, aging or other characteristics of switches 301 and 302 will not affect the scaled size W/L ratios between switches 301 and 302.

Switch 301, which can comprise, for example, a power transistor, can receive power from a power source 322, which is coupled to a source of switch 301, resistive element 304, and switch 302. Amplifier 308 is coupled to resistive elements 304 and 305 via a non-inverting input, and is coupled to second switch 302 via an inverting input. Amplifier 308 can comprise various amplifier configurations for providing an output current $I_{SENSE}$ at output 316.

Switches 301 and 302 are configured with amplifier 308 to operate as a current mirror. For example, the current through switch 302 may be some ratio of the current through switch 301 based on the W/L ratio between switches 301 and 302, e.g., the current through switch 302 may be 1/1000 of the current through switch 301. Of course, the ratio of the current mirror may be any ratio depending on the needs of current sensing system 300.

Resistive elements 304 and 305 may be transistors, discrete resistors, or any other resistive element. Resistive elements 304 and 305 suitably operate as a divider circuit such that the current through switch 301 may be further scaled before reaching amplifier 308. In the exemplary embodiment, resistive elements 304 and 305 are configured to scale down the voltage $V_{DS}$ across switch 301, and provide the scaled down voltage to the non-inverting input of amplifier 308. For example, resistive elements 304 and 305 can be configured to scale down the voltage $V_{DS}$ across switch 301 provided to the non-inverting input of amplifier 308 by one-half, i.e., amplifier 308 receives one-half the voltage across the first switch as a result of the resistive divider comprising resistive elements 304 and 305. Of course, resistive elements 304 and 305 may scale the voltage provided to the input of amplifier 308 by any suitable ratio, including the addition of other divider elements in a divider network. In the exemplary embodiment, resistive element 304 has a source coupled to power source 322, a gate tied to ground, and a drain coupled to a source of resistive element 305. Resistive element 305 has a gate coupled to driving and timing circuit 307 to provide control of operation, and has a drain coupled to a load device. Resistive elements 304 and 305 may also be fabricated on the same integrated circuit such that they are electrically substantially identical. In an alternate embodiment, switches 301 and 302 and resistive elements 304 and 305 may be fabricated using substantially the same process. Thus, current sensing system 30 is substantially insensitive to device, temperature, and process variations.

Amplifier 308 is coupled with resistive elements 304 and 305 and second switch 302, and is configured to sense the scaled down voltage across the first switch at the non-inverting input. In that the output of amplifier 308 is coupled to the inverting input, amplifier 308 is configured to force the voltage across the second switch to be equal to the scaled down voltage across the first switch, such that a current of known proportion to the load current can be provided at the output of the amplifier. Accordingly, the current at output 316 of amplifier 308 is scaled by the current mirror comprising switches 301 and 302, and by the divider circuit comprising resistive elements 304 and 305.

Driver and timing circuit 307 is coupled to gates of switches 301 and 305. Driver and timing circuit 307 is configured to control operation of the sensing of current by current sensing circuit 300, including the biasing of amplifier 308. Driver and timing circuit 307 is configured such that if switch 301 is on, then switch 305 is on, such that amplifier 308 provides a sensed current at amplifier output 316. If, however, switch 301 is off, then switch 305 is also off, i.e., driver and timing circuit 307 decouples the source of switch 305, such that amplifier 308 provides no sensed current at amplifier output 316. Additionally, although switch 301 and switch 305 are off, resistive element 304 suitably operates as a resistive component, such that amplifier 308 may remain biased via power source 322. Accordingly, driver and timing circuit 307 can alleviate the slewing of current through amplifier 308 during the off time of current sensing circuit 300, i.e., when switch 301 is off.

In order to further control the switching of switch 305, driver and timing circuit 307 can also monitor the voltage at node $V_1$ in order to determine when the voltage node at $V_1$ goes high. When the voltage at node $V_1$ goes high, for example when switch 301 turns on, driver and timing circuit 307 is configured to determine when to turn switch 305 on. For example, if there is excessive current through switch 301, e.g., leading edge spike, then driver and timing circuit 307 can recognize the excessive current and delay turning on switch 304. By further monitoring and controlling the sensing of current, current sensing system 300 allows for more precise and efficient current sensing.

Current sensing circuit 300 may also include a switch 306 comprising a follower transistor coupled to amplifier output 316. The source of switch 306 is coupled back to the inverting input of amplifier 308, so as to force the voltage at node 317 to equal the voltage at the non-inverting input of amplifier 308. Switch 306 may be suitably coupled to amplifier 308, e.g., as illustrated in FIG. 3, or can be internal to amplifier 308. As the current increases through switch 301, the voltage across switch 301 increases. Thereafter, amplifier 308 forces the current through switch 302 to ramp-up. The current through switches 302 and 303 may be substantially equal. Thus, current sensing system 300 provides for improved current sensing.

Amplifier 308 can be suitably configured in various arrangements for providing the sensed current $I_{SENSE}$. For example, with reference to FIG. 5, amplifier 308 can be configured as a high speed amplifier 500 in accordance with an exemplary embodiment of the present invention. Amplifier 500 includes an inverting input 512, a non-inverting input 514, switch devices 501, 502, and 504, such as p-channel FET devices, current sources 506, 508, and an output terminal 520. In an exemplary embodiment, inverting input 512 of amplifier 500 couples to the source of FET switch 501. FET switches 501 and 502 share a common gate that is coupled to the drain of FET switch 502, i.e., transistor 502 is diode connected. Current sources 508 and 506 couple to the respective drains of FET devices 500 and 502. The gate of FET device 504 couples to the drain of FET device 501, while the source of FET device 504 couples to the source of FET device 502. The drain of FET device 504 provides the output 520 of amplifier 500.

Amplifier 500 is configured to detects data, e.g., a signal, at inverting input 512. FET switches 501 and 502 provide the gain stage of amplifier 500. FET devices 501 and 502 are in a common gate configuration and behave as high voltage devices, e.g., having a low transconductance $g_m$ with an average speed and accuracy. As the voltage at inverting input 512 decreases, the gate to source voltage of FET device 504 increases, thereby enhancing the device and enabling non-inverting input 514 to track inverting input 512. Thus, by manipulating the configuration of FET switches 501 and 502 and using high voltage devices, a high voltage amplifier 500 can be provided.

Figure 6:
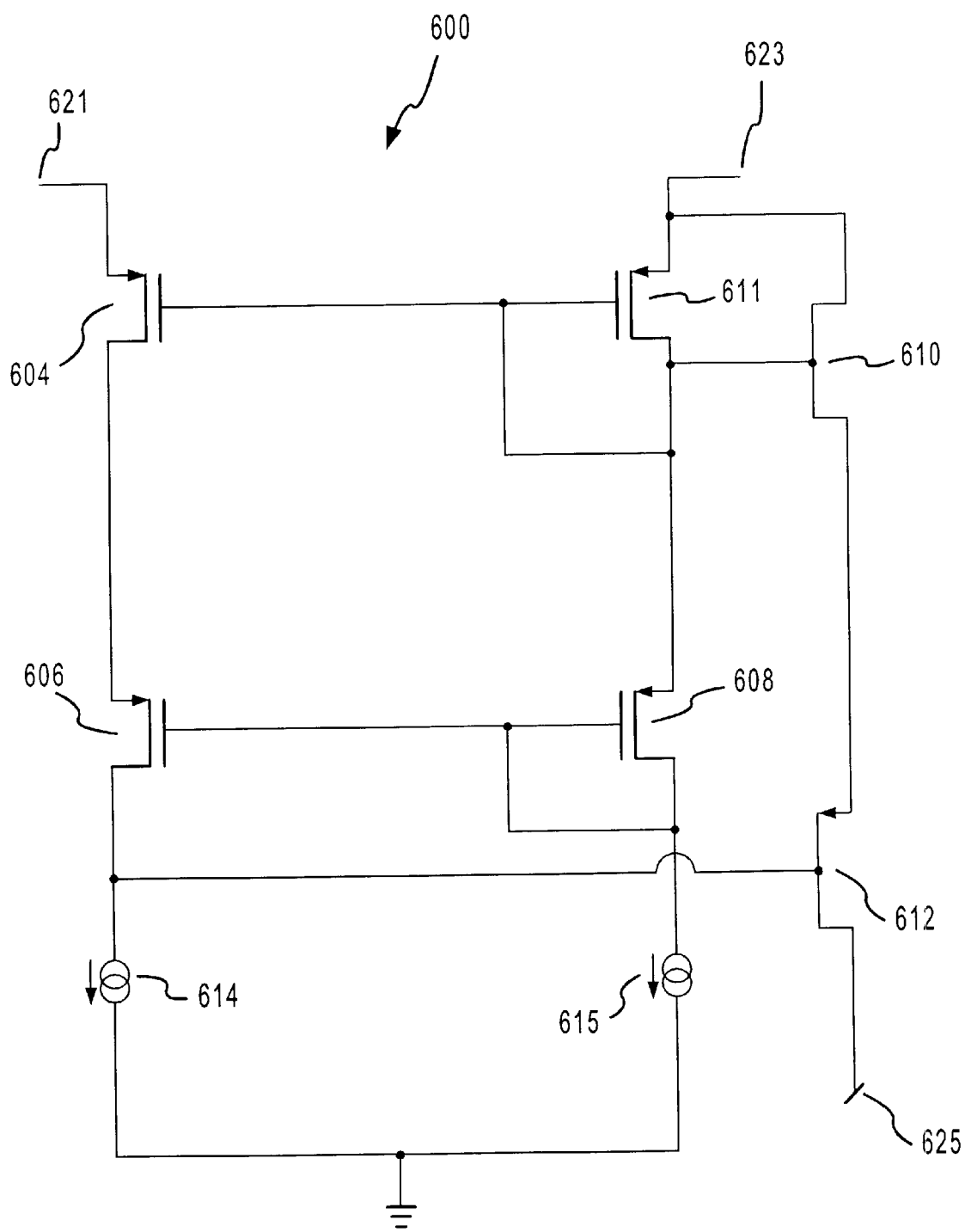
FIG. 6 illustrates an amplifier in accordance with another exemplary embodiment of the present invention.

FIG. 6 illustrates an amplifier 600 in accordance with another exemplary embodiment of the present invention. Amplifier 600 includes an inverting input 621, a non-inverting input 623, switches 604, 606, 608, 610, 611, and 612, current sources 614 and 615, and an output 625. Switches 604, 610 and 611 are configured to provide a gain stage, and suitably comprise low voltage devices, having a high transconductance $g_m$ for high speed and accuracy. Amplifier 600 has a non-inverting input 621 coupled to a source of switch 604, and an inverting input 623 coupled to a source of switch 611 and a source of switch 610. Switch 610 also has a gate coupled to a drain of switch 611. Switches 606, 608 and 612 suitably comprise high voltage cascode devices. In addition, switches 604 and 611 share a common gate, while switches 606 and 608 share a common gate. The gates and drains of each of switches 611 and 608 are coupled together, i.e., switches 611 and 608 are diode connected. Current sources 614 and 615 couple to the respective drains of switches 606 and 608, while current source 614 also couples to a gate of switch 612. In addition, switch 612 has a source coupled to a drain of switch 610, and a drain configured to provide the output of amplifier 600 at output terminal 625.

Similar to amplifier 500, amplifier 600 detects data, e.g., a signal, at non-inverting input 621. Switches 604, 610 and 611 provide the gain stage of amplifier 600. Switches 604 and 611 behave as low voltage devices, e.g., high transconductance $g_m$ with high speed and accuracy. In this way, low voltage devices are cascoded with high voltage devices. As a result of this configuration, amplifier 600 can provide slew rate compensation. As the voltage at inverting input 621 decreases, the gate-source VGS voltage across switch 612 increases, thereby enhancing the device and enabling non-inverting input 621 to track inverting input 623. Current sources 614 and 615 may be matching current sources. Thus, by manipulating the configuration of switches 604, 611, 606, and 608 and using low voltage devices for switches 604, 610 and 611, a high voltage amplifier, e.g., amplifier 600 or any amplifier having a high output impedance, may behave as a low voltage device having a high speed and accuracy. Accordingly, amplifier 600 uses low voltage transistors with an overlay of high voltage transistors.

Figure 5:
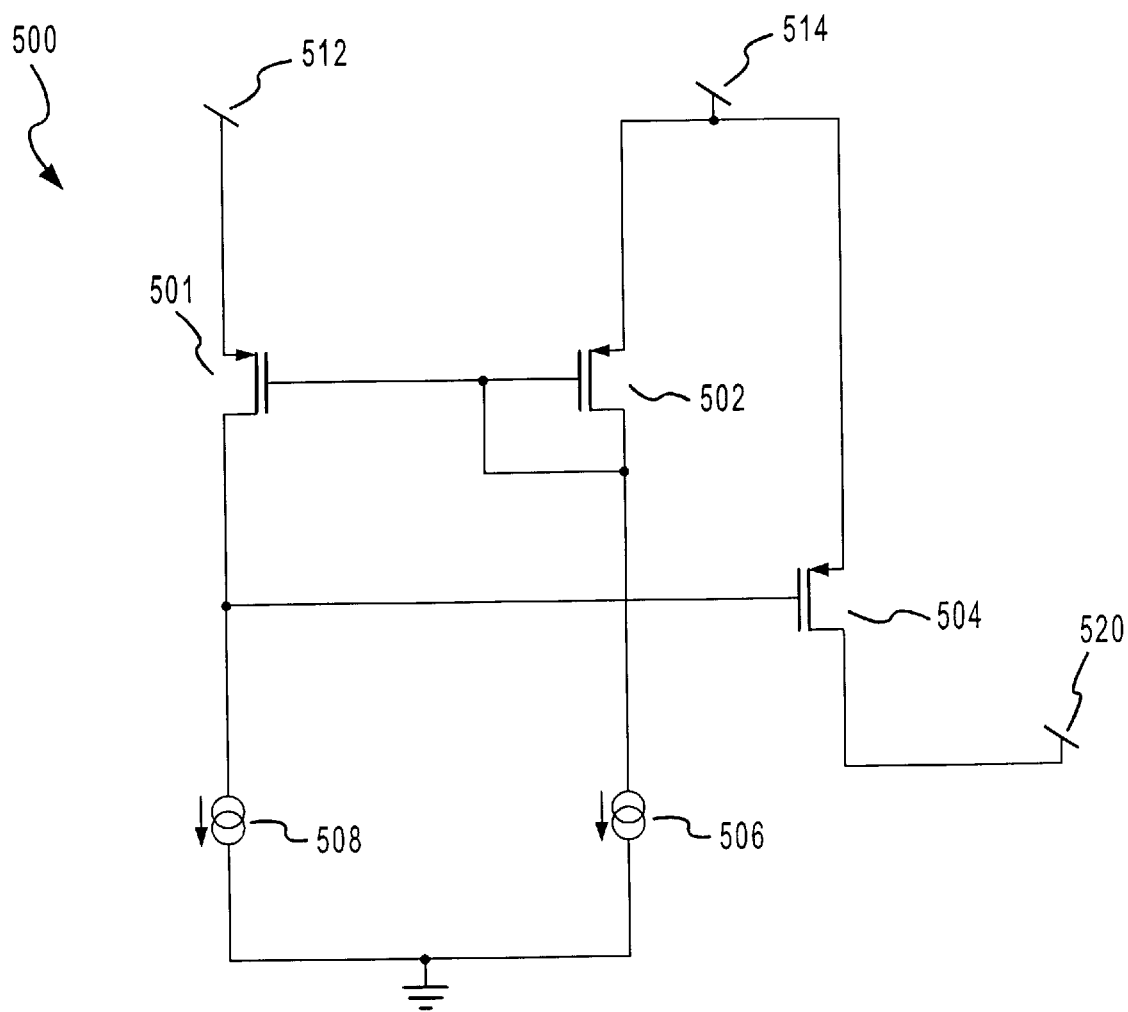
FIG. 5 illustrates an amplifier in accordance with an exemplary embodiment of the present invention.
Figure 7:
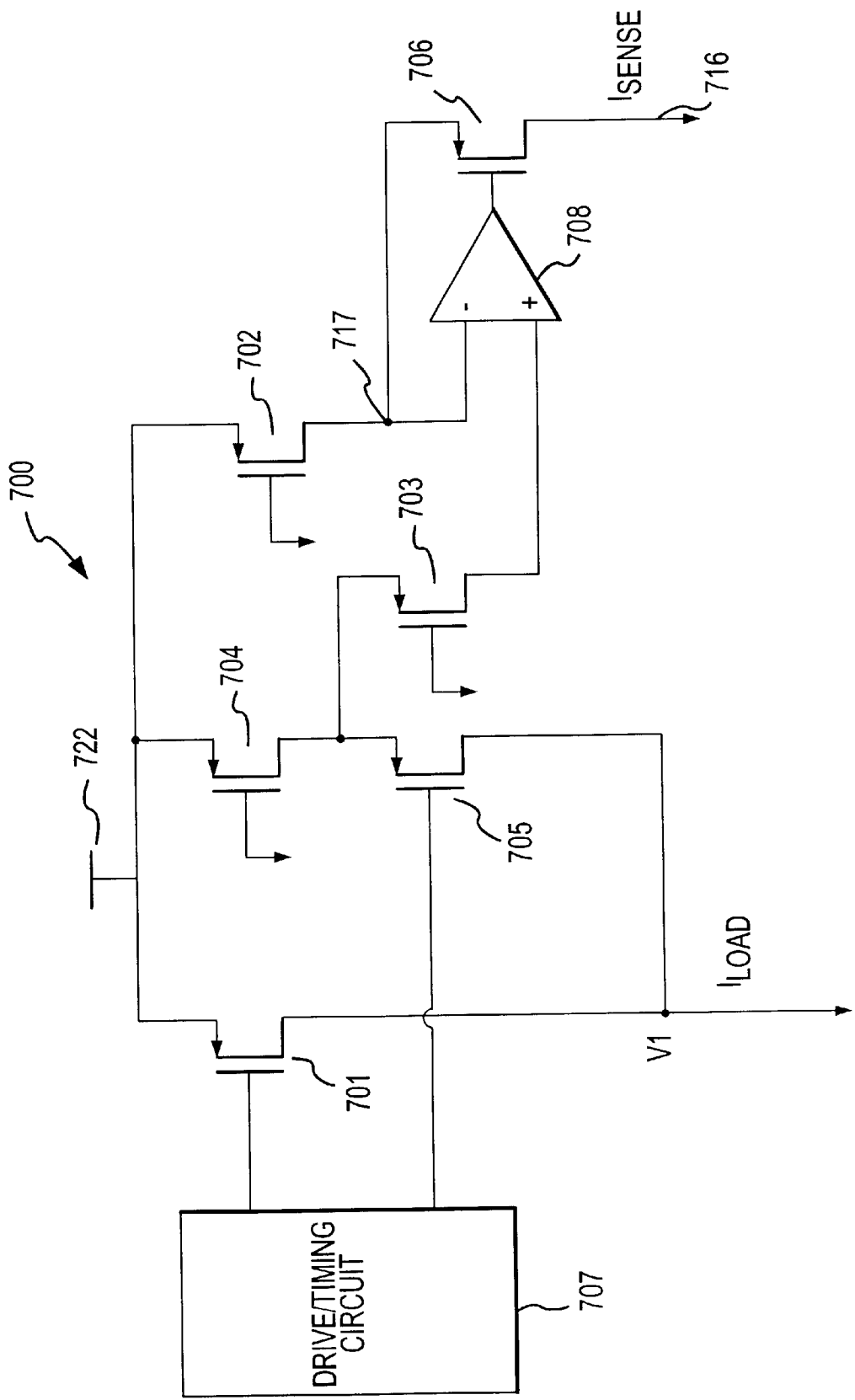
FIG. 7 illustrates a current sensing system in accordance with another exemplary embodiment of the present invention.

In accordance with another exemplary embodiment, when amplifier 308 is configured as a common-gate amplifier, such as is illustrated in FIG. 5, current sensing system 300 can also be configured with a current common-mode transistor for biasing the common gate amplifier. For example, in accordance with another exemplary embodiment of the present invention, with reference to FIG. 7, an exemplary current sensing system 700 is configured with a current common-mode transistor 703 for providing a common mode current to offset that provided by second switch 702. Current sensing system 700 also includes switches 700, 702, 704, 705, and 706, an amplifier 708, a driver and timing circuit 707, an input voltage 722, and amplifier output 716, which comprise like elements to those illustrated with reference to FIG. 3. Moreover, operation of current sensing system 700 is similar to current sensing system 300, with the addition of a biasing current provided, for example, 100 microamps, to non-inverting input of amplifier 708 to offset a common-mode current, comprising for example 100 microamps, provided at the drain of switch 702.

Figure 4:
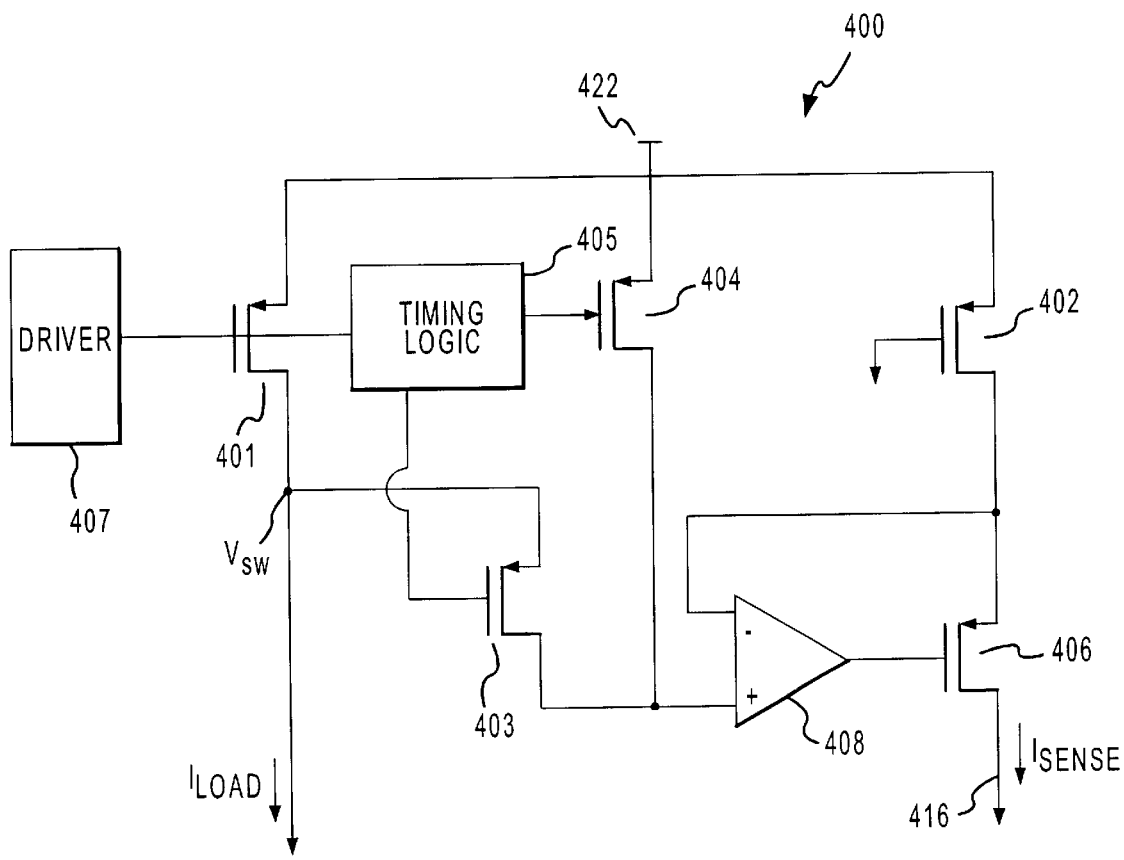
FIG. 4 illustrates a current sensing system using a timing logic circuit in accordance with an exemplary embodiment of the present invention.

An exemplary current system can be configured in various other manners for providing control of the slewing of an amplifier during the off time of the current sensing circuit. For example, with reference to FIG. 4, an exemplary current sensing system 400 is illustrated in accordance with an exemplary embodiment of the present invention. Current sensing system 430 includes switches 401, 402, 403, 404, and 406, timing logic 405, amplifier 408, a driver circuit 407, input voltage 422, and amplifier output 416. Current sensing system 400 operates similar to current sensing systems 300, except current sensing system 400 does not include a dividing circuit for dividing down the voltage at a node $V_{SW}$. Thus, amplifier 408 is configured to force the voltage at the non-inverting input, i.e., the voltage at the drain of switch 402 is forced by amplifier 408 to be equal to the voltage at a node $V_{SW}$.

Power switch 401 has a source coupled to a power source 422, a drain coupled to a load device, and a gate coupled to driver circuit 407 to control operation of switch 401. Switch 402 is similarly configured as switch 302 of FIG. 3. Switch 403 includes a source coupled to the load device, a drain coupled to non-inverting input of amplifier 408, and a gate coupled to timing logic 405. Switch 404 includes a source coupled to power source 422, a drain coupled to non-inverting input of amplifier 408, and a gate coupled to timing logic 405.

Driver circuit 407 is coupled to switch 401 and timing logic 405. Driver circuit 407 and timing logic 405 are configured such that if switch 401 is on, then switch 403 is on, so that amplifier 408 provides a sensed current $I_{SENSE}$ at amplifier output 416. If, however, switch 401 is off, then switch 403 is also off. As a result, switch 403 decouples the voltage at node $V_{SW}$ from amplifier 408, such that amplifier 408 senses no current at amplifier output 416. Additionally, if switch 400 is off, then switch 404 behaves as a resistive element, such that amplifier 408 may remain biased.

In order to further control the switching of switch 403, timing logic 405 monitors the voltage at node $V_{SW}$ in order to determine when the voltage node at $V_{SW}$ goes high. When the voltage at node $V_{SW}$ goes high, for example when switch 401 turns on, timing logic 405 is configured to determine when to turn switch 403 on. For example, if there is excessive current through switch 401, e.g., leading edge spike, then timing logic 405 can recognize the excessive current and delay turning on switch 403. By further monitoring and controlling the sensing of current, current sensing system 400 allows for more precise and efficient current sensing.

Figure 9A:
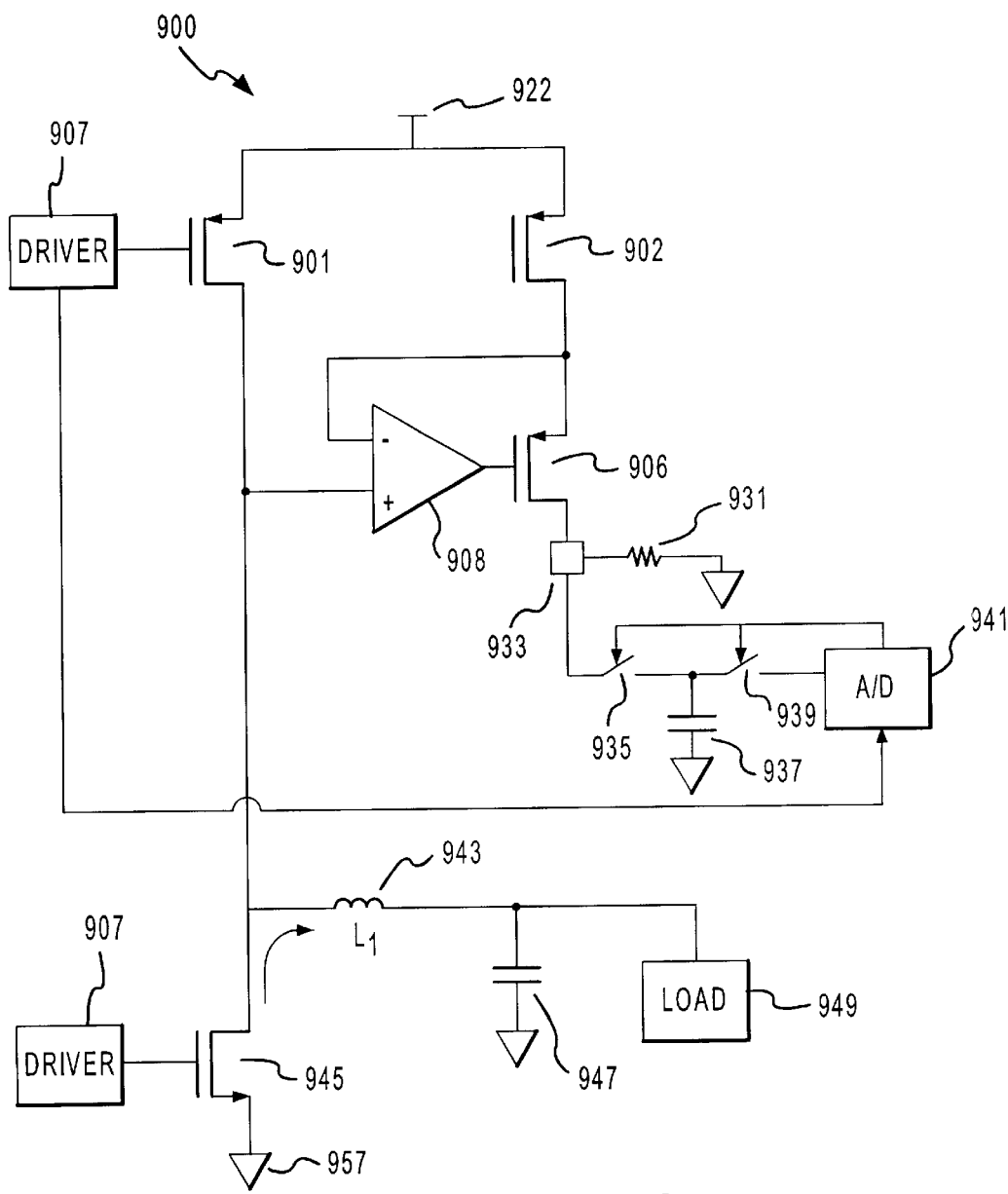
FIG. 9A illustrates a current sensing system in accordance with an exemplary embodiment of the present invention.

The various exemplary current sensing systems disclosed above can be configured within various current sensing applications. For example, in accordance with an exemplary embodiment of the present invention, with reference to FIG. 9A, an exemplary current sensing system 900 can be configured with an analog-to-digital converter 941 in a track-and-hold application. Current sensing system 900 includes switches 901, 902, 906, 935, 939, and 945, a driver 907, an amplifier 908, a input voltage 922, a load 933, resistor 931, capacitor 937, analog-to-digital converter 941, inductor 943, capacitor 947, and load 949. Driver 907 alternately couples switches 901 and 945 from input voltage 922 to ground 957.

Figure 9B:
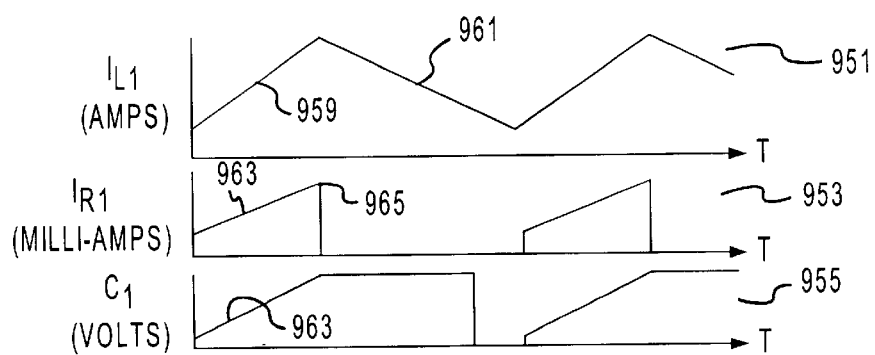
FIG. 9B illustrates a timing diagram for operation of the switch mode circuit of FIG. 9A.

In operation, when switch 901 is on, then switch 945 is off. Amplifier 908 provides a sensed current which creates a voltage across resistor 931. The voltage across resistor 931 charges-up capacitor 937 when switch 935 is closed and switch 939 is open, wherein switches 935 and 939, along with capacitor 937, illustrate a track and hold (or sample and hold) circuit. In operation, with reference to the graphical illustration of FIG. 9B, the sensed current, e.g., see current $I_{R1}$, increases by a scaled ratio to the output inductor current $I_{L1}$. Thus, the sensed current $I_{R1}$, is converted to a voltage by charging capacitor 937 and generates a voltage across resistor 931 as the voltage across capacitor 937 ramps-up. At the peak value of inductor current $I_{L1}$, the track and hold circuit allows analog-to-digital converter 941 to convert analog information (e.g., signal) to digital information (e.g., signal). Just prior to turning off the high side power device, i.e., switch 901, switch 935 opens and switch 939 closes. The timing of this event is derived from the driver circuit 907. The voltage across capacitor 937 is held until the analog-to-digital converter completes the conversion of the sampled voltage.

Alternatively, when switch 945 is on, then switch 901 is off. When switch 901 is off, then the track and hold circuit discussed above is converting the sampled data. At this point, the current $I_{L1}$, ramps down through inductor 943, as illustrated in curve 961. Thus, current sensing system 900 provides a configuration wherein driver 907 provides timing for operation of the track-and-hold circuit, including analog-to-digital converter 941.

Figure 8A:
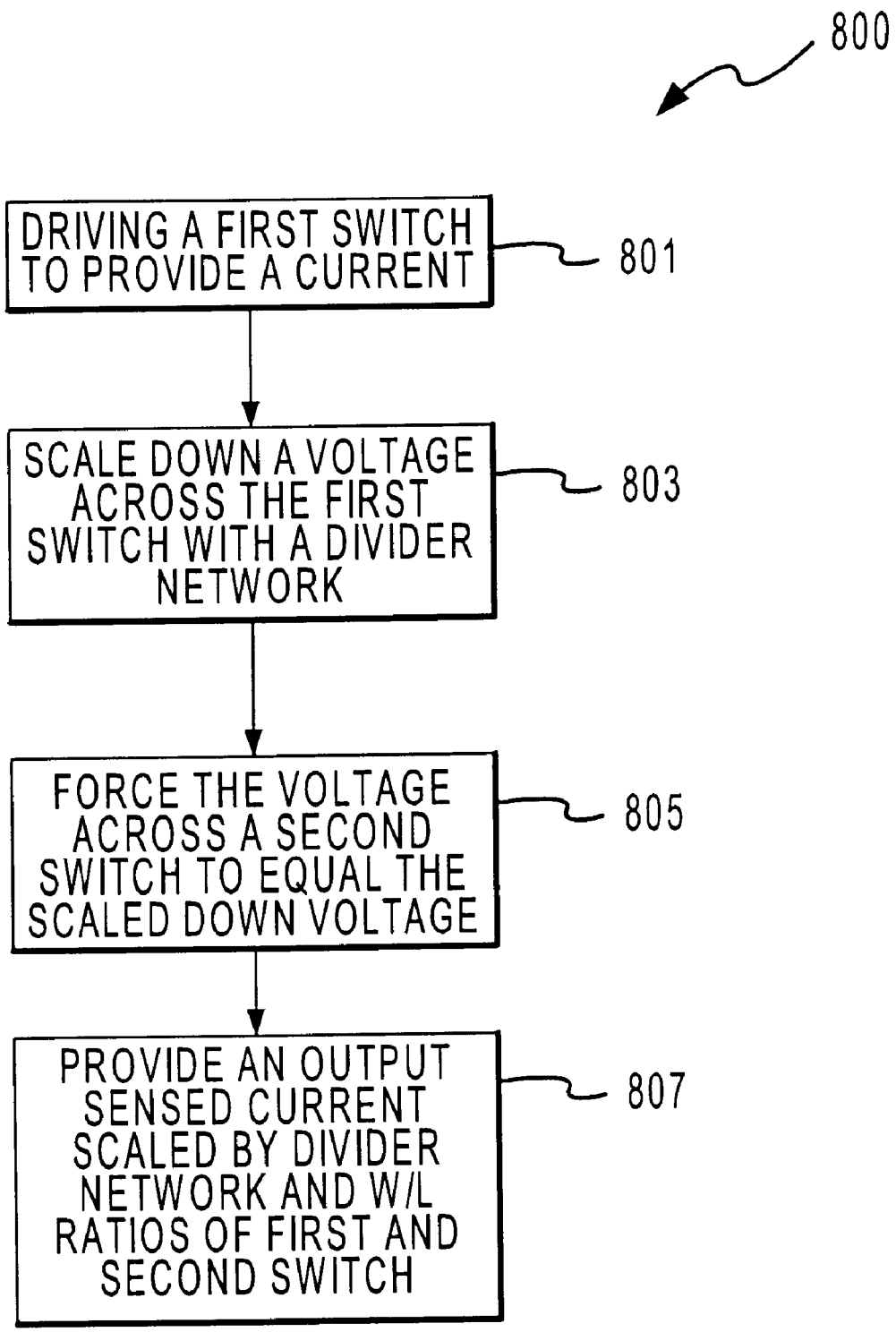
FIG. 8A illustrates a flowchart including a method for current sensing in accordance with an exemplary embodiment of the present invention.

Having described various exemplary embodiments of current sensing systems, with reference to FIG. 8A, a flowchart illustrates a method 800 of current sensing in accordance with an exemplary embodiment of the present invention. Driving a first switch, e.g., a power device comprising a switch 301, 401, or the like, provides a current through the switch in a step 801. The current through the switch creates a voltage drop, $V_{DS}$, equal to the product of the resistance of the switch and the drive current. A second switch, e.g., a sense device comprising switches 302, 402, or the like, is configured with an amplifier, such as amplifiers 308 or 408, to mirror the current through the first switch to provide a second current at the output of the amplifier. The current sensing system is be configured such that the second current is a ratio of the current through the power switch. A resistive network, such as resistive elements 304 and 305 or 403 and 404, scales down the voltage $V_{DS}$ across the first switch in a step 803, such as by dividing in half, and provides to the input of an amplifier. In addition, the switches may be fabricated using substantially the same process. Amplifier forces the voltage $V_{DS}$ of the sense device to be equal to the scaled down voltage $V_{DS}$ of the first switch in a step 805. As a result, a sense current is provided at the output of the amplifier in step 807, and is scaled due to W/L ratio of power device and sense device, as well as the resistive network. Thus, the switches are configured as low voltage devices and the amplifier is configured as a high-speed amplifier, so that the current sensing system is faster and provides improved efficiency.

Figure 8B:
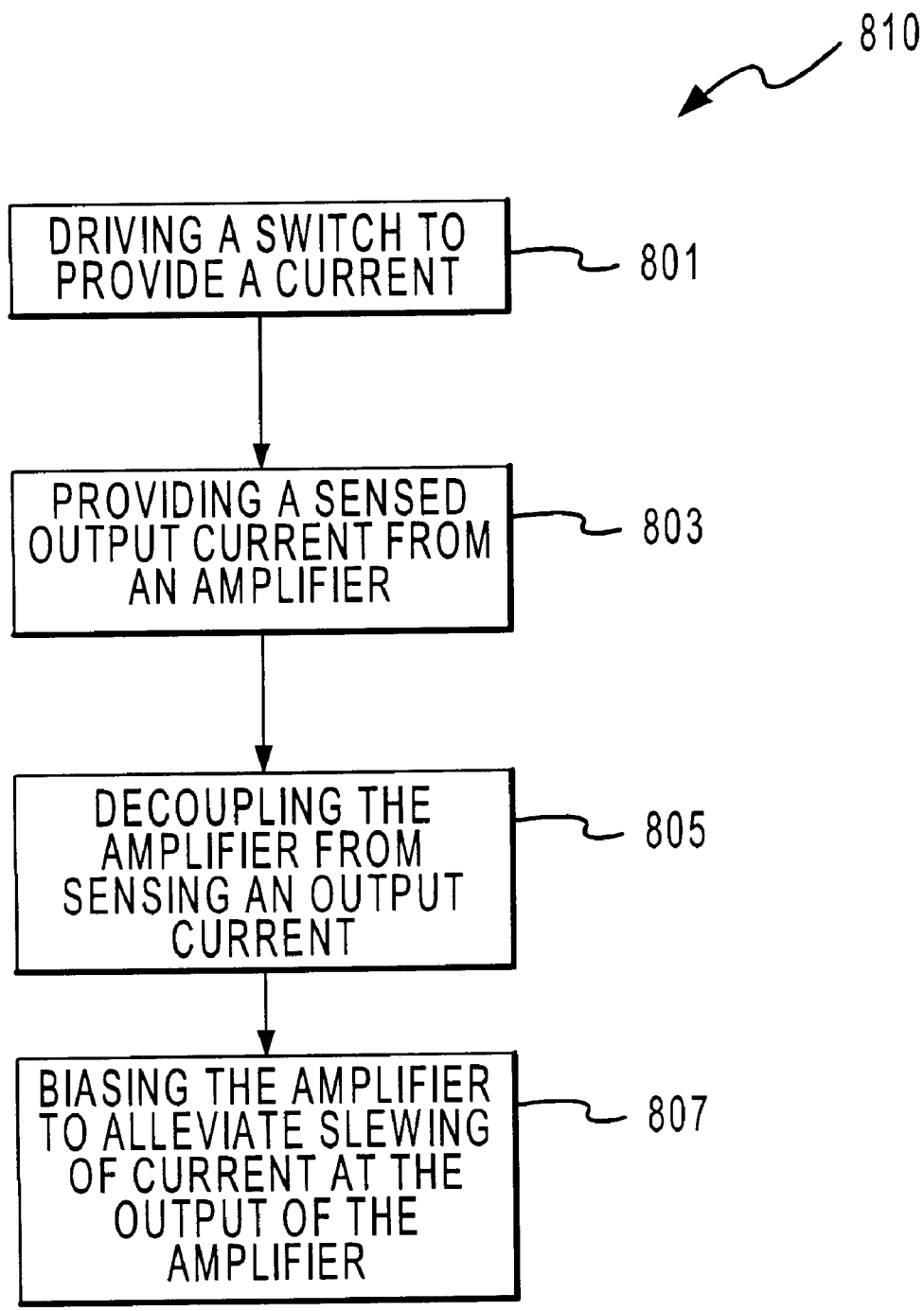
FIG. 8B illustrates a flowchart including a method for current sensing in accordance with another exemplary embodiment of the present invention.

With reference to FIG. 8B, a flowchart illustrates another method 810 of current sensing in accordance with another exemplary embodiment of the present invention. With additional reference again to FIG. 3, driving a first switch, e.g., a power device comprising a switch 301, 401, or the like, provides a current through the switch in a step 811. Driver and timing circuit 307 is configured such that if switch 301 is on, then switch 305 is on, such that amplifier 308 provides a sensed current at amplifier output 316 in a step 813. If, however, switch 301 is turned off, then switch 305 is also turned off, and thus driver and timing circuit 307 decouples the source of switch 305 such that amplifier 308 provides no sensed current at amplifier output 316 in a step 815. Additionally, although switch 301 and switch 305 are off, resistive element 304 suitably operates as a resistive component, such that amplifier 308 may remain biased via power source 322 in a step 817. Accordingly, driver and timing circuit 307 can alleviate the slewing of current through amplifier 308 during the off time of current sensing circuit 300, i.e., when switch 301 is off.

Step 813 for providing a sensed output current can also be configured to further control the switching of switch 305. For example, driver and timing circuit 307 can also monitor the voltage at node $V_1$ in order to determine when the voltage node at $V_1$ goes high. When the voltage at node $V_1$ goes high, for example when switch 301 turns on, driver and timing circuit 307 is configured to determine when to turn switch 305 on. For example, if there is excessive current through switch 301, e.g., leading edge spike, then driver and timing circuit 307 can recognize the excessive current and delay turning on switch 305 to provide the sensed output current in step 813. By further monitoring and controlling the sensing of current, the current sensing system allows for more precise and efficient current sensing.

In the foregoing specification, the invention has been described with reference to specific embodiments. However, it will be appreciated that various modifications and changes can be made without departing from the scope of the present invention as set forth in the claims below. The specification and figures are to be regarded in an illustrative manner, rather than a restrictive one, and all such modifications are intended to be included within the scope of present invention. For example, although the invention is described above in connection with a current sense device, suitable voltage rate of change sensing devices or a combination of voltage and current rate of change sense devices may be employed in the systems of the present invention. Accordingly, the scope of the invention should be determined by the appended claims and their legal equivalents, rather than by the examples given above. For example, the steps recited in any of the method or process claims may be executed in any order and are not limited to the order presented in the claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims, unless specifically indicated. As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical".

What is claimed is:

1. A current sensing system, comprising:
   a current mirror circuit comprising a power switch having a number of unit cells, and a sensing switch coupled to the power switch and being a scaled ratio of said power switch;
   a resistive divider circuit coupled between the power switch and the sensing switch for dividing down a voltage across the power switch; and
   an amplifier configured to receive the divided down voltage as an input, and being coupled to the sensing switch to force a voltage across the sensing switch to be equal to the divided down voltage across the power switch, and for providing an output sensed current having a known proportion to a current through the power device.

2. The current sensing system of claim 1, further comprising a driver and timing circuit coupled to the power switch and the resistive divider circuit to alleviate the slewing of current through the amplifier.

3. The current sensing system of claim 1, further comprising timing logic coupled between the power switch and the resistive divider circuit for monitoring voltage at a node between the power switch and the resistive divider circuit.

4. The current sensing system of claim 1, wherein the current mirror circuit and the amplifier are fabricated using substantially the same process.

5. The current sensing system of claim 1, wherein the current mirror circuit, the resistive divider circuit, and the amplifier are fabricated using substantially the same process.

6. The current sensing system of claim 1, wherein the power switch and the sensing switch each comprise a plurality of multi cell devices.

7. The current sensing system of claim 1, wherein the power switch and the sensing switch each operate in a deep triode region.

8. A current sensing system, comprising:
   a power transistor having a source coupled to a voltage source for providing a current through the power transistor, and a drain coupled to a load;
   a sensing transistor having a source coupled to the voltage source, and a gate coupled to ground;
   an amplifier having an inverting input coupled to a drain of said sensing transistor and to an output of the amplifier, the amplifier configured to provide a output sensed current having a scaled proportion to the current through the power transistor;
   a third transistor having a source coupled to the voltage source and a drain coupled to a non-inverting input terminal of the amplifier;
   a fourth transistor coupled between the load and the amplifier, the fourth transistor being configured for coupling the amplifier to receive at least some portion of a voltage across the power transistor;
   a driver and timing circuit configured for control of the amplifier, the driver and timing circuit being coupled to a gate of the power transistor and a gate of the fourth transistor, and configured for monitoring the voltage at the drain of the power transistor to determine whether to permit the fourth transistor to provide the at least some portion of the voltage across the power transistor to the amplifier.

9. The current sensing system of claim 8, wherein the power transistor, sensing transistor, third transistor, fourth transistor, and amplifier are fabricated using substantially the same CMOS process.

10. The current sensing system of claim 8, wherein the third transistor has a gate coupled to ground, and the fourth transistor has a source coupled to the non-inverting input of the amplifier and a drain coupled to the load, and wherein the third transistor and the fourth transistor are configured for dividing down the voltage across the power transistor, and the amplifier is configured to receive the divided down voltage as an input, and forcing the voltage across the sensing switch to be equal to the divided down voltage.

11. The current sensing system of claim 8, wherein the driver and timing circuit comprises separate driver and timing logic components, the third transistor has a gate coupled to the timing logic component, the fourth transistor has a source coupled to the drain of the power transistor, the gate coupled to the timing logic component, and a drain coupled to the non-inverting input of the amplifier, and wherein the timing logic components is configured for monitoring the voltage at the drain of the power transistor to determine whether to permit the fourth transistor to provide the voltage at the drain of the power transistor to the amplifier.

12. The current sensing system of claim 8, wherein the current system further includes:
a third switch coupled to the non-inverting input of the amplifier, wherein the amplifier comprises as a common gate amplifier.

13. The current sensing system of claim 8, wherein the amplifier includes:
a gain stage comprising a fourth switch and a fifth switch, each configured as low voltage devices having a higher transconductance, and having common-gate connections, the fifth switch being connected as a diode device, the fourth switch having a source configured as a non-inverting input terminal, and the fifth switch having a source configured as an inverting input terminal;
a cascode stage comprising a sixth switch and a seventh switch, each configured as high voltage devices having a lower transconductance, and having common-gate connections, the sixth switch being connected as a diode device, the seventh switch having a source coupled to a drain of the fourth switch, and the seventh switch having a source coupled to a drain of the fifth switch;
a first current source coupled between a drain of the sixth switch and ground, and a second current source coupled between a drain of the seventh switch and ground;
an eighth switch having a source coupled to the inverting input terminal, a gate coupled to the drain of said fifth switch; and
a ninth switch having a source coupled to a drain of said eighth switch, a gate coupled to the drain of said sixth switch, and a drain configured for providing an output for the amplifier, wherein the amplifier is configured such that as a voltage at the inverting input terminal increases, a gate-source voltage across the ninth switch will increase to facilitate the tracking of the inverting input terminal by the non-inverting terminal.

14. A current sensing system, comprising:
a power transistor having a source coupled to a voltage source for providing a current through the power transistor, and a drain coupled to a load;
a sensing transistor having a source coupled to the voltage source, and a gate coupled to ground
an amplifier having an inverting input coupled to a drain of said sensing transistor and to an output of the amplifier, the amplifier configured to provide a output sensed current having a scaled proportion to the current through the power transistor;
a third transistor having a source coupled to the voltage source and a drain coupled to a non-inverting input terminal of the amplifier;
a fourth transistor having a source coupled to the drain of the power transistor and a drain coupled to the non-inverting input terminal of the amplifier, the fourth transistor being configured for decoupling the amplifier from receiving a voltage at the drain of the power transistor;
a driver circuit configured for control of the amplifier, the driver circuit being coupled to a gate of the power transistor; and
a timing logic device for controlling operation of the third transistor and the fourth transistor and being coupled to gates of the third transistor and the fourth transistor and configured for monitoring the voltage at the drain of the power transistor to determine whether to permit the fourth transistor to provide the voltage at the drain of the power transistor to the amplifier.

15. The current sensing system according to claim 14, the third transistor being configured as a resistive element such that the amplifier can remain biased when the power transistor is not operating.

16. The current sensing system according to claim 14, wherein the power transistor, the sense transistor, the third transistor and the fourth transistor are fabricated using the substantially the same process.

17. The current sensing system according to claim 14, wherein the power transistor and the sense transistor comprise multi-cell devices.

18. The current sensing system according to claim 14, further comprising a follower transistor having a source coupled to the drain of the sense transistor, a gate coupled to the output of the amplifier, and a drain configured to provide the output sensed current.

19. The current sensing system of claim 14, wherein the amplifier includes:
a first switch coupled to the inverting input of the amplifier;
a second switch coupled to the non-inverting input of the amplifier, wherein the first and second switches share a common gate and the second switch is diode connected;
a third switch coupled to the first switch and the non-inverting input of the amplifier;
a first current source coupled to the first and third switches;
a second current source coupled to the second switch; and
an output providing the output sensed current.

20. The current sensing system of claim 19, wherein the amplifier further includes:
a fourth switch coupled between the first switch and the first current source for buffering;
a fifth switch coupled between the second switch and the second current source for buffering; and
a sixth switch coupled between the non-inverting input of the amplifier, the second switch, and the third switch for providing a voltage to the third switch.

21. A current sensing system, comprising:
a first switch having first, second, and third terminals, wherein the first terminal is coupled to an input voltage and the second terminal is coupled to a driver for control of the first switch, and the third terminal is coupled to a load device;
a second switch having fourth, fifth, and sixth terminals, wherein the fourth terminal is coupled to the input voltage, the fifth terminal is coupled to ground, and wherein a resistance of the second switch is a proportion of a resistance of the first switch;
an amplifier having inverting and non-inverting inputs and an amplifier output, wherein the inverting input is coupled to the sixth terminal and the amplifier output; and
a divider circuit comprising a third transistor and a fourth transistor, wherein the third transistor and fourth transistor comprise resistive elements, the third transistor having a source coupled to the input voltage, a gate coupled to ground, and a drain coupled to the non-inverting input of the amplifier, and the fourth transistor having a source coupled to the drain of the third transistor, a gate coupled to the driver for control of the fourth transistor, and a drain coupled to the load device, and wherein the divider circuit is configured for dividing down a voltage across the first switch to facilitate scaling down of a current passing through the first switch being sensed at the output of the amplifier.

22. The current sensing system according to claim 21, wherein the amplifier comprises a common-gate amplifier, and wherein the current sensing system further comprises a current common-mode transistor having a source coupled to the source of the fourth transistor, a gate coupled to ground, and a drain coupled to a non-inverting input of the amplifier, and being configured for biasing the amplifier.

23. The current sensing system of claim 21, wherein the first and second switches, the divider circuit, and the amplifier are fabricated using substantially the same process.

24. A method for sensing current, comprising the steps of:
driving a first switch to provide a first current;
mirroring the first current via a second switch coupled to the first switch thereby providing a second current, wherein the second current is a ratio of the first current and the first and second switches are fabricated using substantially the same process;
dividing the second current via a divider circuit in order to further scale the second current into a third current, wherein the third current is a ratio of the second current; and
detecting the voltage across the first switch via an amplifier, wherein the amplifier provides an output voltage that is proportional to the voltage across the first switch.

25. A method for sensing current comprising the steps of:
driving a first switch to provide a current through the first switch to create a voltage across the first switch;
scaling down the voltage across the first switch and providing the scaled down voltage to an input of an amplifier;
forcing a voltage across a second switch to be equal to the scaled down voltage of the first switch, the second switch being coupled to another input of the amplifier and an output of the amplifier; and
providing an output sensed current at the output of the amplifier representing a known proportion to the current through the first switch.

26. The method according to claim 25, wherein the first switch, second switch and amplifier are configured in a current mirror arrangement.

27. The method according to claim 25, wherein the second switch and the first switch comprise transistors scaled on the basis of a W/L ratio.

28. The method of claim 25, further comprising the steps of:
using a divider circuit to scale down the voltage across the first switch;
configuring the first and second switches as low voltage devices; and
configuring the amplifier as a high-speed amplifier.

29. The method of claim 25, further comprising the step of monitoring the voltage across the first switch to determine whether to couple a third transistor to the amplifier to receive the scaled down voltage.

30. A method for fabricating a current sensing system, comprising the steps of:
fabricating first and second switches on an integrated circuit using substantially the same process, wherein the integrated circuit is configured to:
drive the first switch to provide a first current;
mirror the first current via the second switch coupled to the first switch thereby providing a second current, wherein the second current is a ratio of the first current;
divide the second current via a resistor divider in order to further scale the second current into a third current, wherein the third current is a ratio of the second current; and
detect the voltage across the first switch via an amplifier, wherein the amplifier provides an output voltage that is proportional to the voltage across the first switch.

31. A current sensing system, comprising:
a first switch coupled to first and second resistive elements, where the first and second resistive elements scale the current output from the first switch;
a second switch coupled to the first switch for mirroring the current output from the first switch; and
an amplifier coupled between the first and second resistive elements and the second switch for sensing current, wherein the amplifier includes:
a third switch coupled to the inverting input of the amplifier;
a fourth switch coupled to the non-inverting input of the amplifier, wherein the third and fourth switches share a common gate and the fourth switch is diode connected;
a fifth switch coupled to the third switch and the non-inverting input of the amplifier;
a first current source coupled to the third and fifth switches;
a second current source coupled to the fourth switch; and
an output to the amplifier for providing an output voltage.

32. A current sensing system, comprising:
a first switch having first, second, and third terminals, wherein the first terminal is coupled to an input voltage and the second terminal is coupled to a driver;
a second switch having fourth, fifth, and sixth terminals, wherein the fourth terminal is coupled to the input voltage, the fifth terminal is coupled to an amplifier, and the third terminal is coupled to ground, and wherein the current through the second switch is a scaled current through the first switch;

the amplifier having inverting and non-inverting inputs and an amplifier output, wherein the inverting input is coupled to the fifth terminal and the amplifier output, and wherein the amplifier includes:
   a third switch coupled to the inverting input of the amplifier;
   a fourth switch coupled to the non-inverting input of the amplifier, wherein the third and fourth switches share a common gate and the fourth switch is diode connected;
   a fifth switch coupled to the third switch and the non-inverting input of the amplifier;
   a first current source coupled to the third and fifth switches;
   a second current source coupled to the fourth switch; and
   an output to the amplifier for providing an output voltage; and
a divider circuit coupled between the third terminal and the non-inverting input of the amplifier for scaling the current through the first switch.

33. A current sensing system, comprising:
a power transistor having a source coupled to a voltage source for providing a current through the power transistor, and a drain coupled to a load;
a sensing transistor having a source coupled to the voltage source, and a gate coupled to ground;
an amplifier having an inverting input coupled to a drain of said sensing transistor and to an output of the amplifier, the amplifier configured to provide a output sensed current having a scaled proportion to the current through the power transistor;
a third transistor having a source coupled to the voltage source and a drain coupled to a non-inverting input terminal of the amplifier;
a fourth transistor coupled between the load and the amplifier, the fourth transistor being configured for decoupling the amplifier from receiving a voltage at the drain of the power transistor;
a driver and timing circuit configured for control of the amplifier, the driver and timing circuit being coupled to a gate of the power transistor and a gate of the fourth transistor, and configured for monitoring the voltage at the drain of the power transistor to determine whether to permit the fourth transistor to provide the voltage at the drain of the power transistor to the amplifier.

* * * * *